(12) United States Patent
Tanaka et al.

(10) Patent No.: US 10,177,234 B2
(45) Date of Patent: Jan. 8, 2019

(54) SEMICONDUCTOR DEVICE

(71) Applicant: TOYODA GOSEI CO., LTD., Kiyosu-shi (JP)

(72) Inventors: Nariaki Tanaka, Kiyosu (JP); Tohru Oka, Kiyosu (JP)

(73) Assignee: TOYODA GOSEI CO., LTD., Kiyosu-Shi, Aichi-Ken (JP)

( * ) Notice: Subject to any disclaimer, the term of this patent is extended or adjusted under 35 U.S.C. 154(b) by 0 days.

(21) Appl. No.: 15/916,790

(22) Filed: Mar. 9, 2018

(65) Prior Publication Data

US 2018/0261673 A1 Sep. 13, 2018

(30) Foreign Application Priority Data

Mar. 13, 2017 (JP) ................. 2017-047334

(51) Int. Cl.
*H01L 29/417* (2006.01)
*H01L 29/20* (2006.01)
*H01L 29/78* (2006.01)
*H01L 29/66* (2006.01)

(52) U.S. Cl.
CPC .... *H01L 29/41741* (2013.01); *H01L 29/2003* (2013.01); *H01L 29/66734* (2013.01); *H01L 29/7813* (2013.01)

(58) Field of Classification Search
CPC ........... H01L 29/41741; H01L 29/2003; H01L 29/66734
See application file for complete search history.

(56) References Cited

U.S. PATENT DOCUMENTS

| 2004/0135178 A1* | 7/2004 | Onose ................. H01L 29/1066 257/262 |
| 2008/0230787 A1* | 9/2008 | Suzuki ................ H01L 29/0623 257/77 |
| 2010/0006929 A1* | 1/2010 | Andou ................ H01L 29/0623 257/330 |

(Continued)

OTHER PUBLICATIONS

IEEE Electron Device Letters, vol. 37, No. 4 Apr. 2016 p. 463-466.

*Primary Examiner* — Errol Fernandes
(74) *Attorney, Agent, or Firm* — McGinn IP Law Group, PL.L.C

(57) ABSTRACT

A semiconductor device having a trench gate structure is configured to include a first n-type semiconductor layer, a p-type semiconductor layer, a trench, an insulating film, a gate electrode, a source electrode and a drain electrode. The first n-type semiconductor layer includes a p-type impurity-containing region configured to contain a p-type impurity at a higher concentration than an n-type impurity. The p-type impurity-containing region is arranged to adjoin the p-type semiconductor layer. In a stacking direction of the first n-type semiconductor layer and the p-type semiconductor layer, the p-type impurity-containing region is provided at a position that does not at least partly overlap with the source electrode and that overlaps with an outer periphery of a bottom face of the trench. This configuration suppresses an increase in capacity between the drain and the source, while improving the breakdown voltage of the semiconductor device.

8 Claims, 14 Drawing Sheets

(56) References Cited

U.S. PATENT DOCUMENTS

2013/0164895 A1\* 6/2013 Zeng .................. H01L 29/7827
                                                    438/270
2017/0263757 A1\* 9/2017 Saikaku ................ H01L 21/046
2018/0097061 A1\* 4/2018 Mimura .................. H01L 29/78
2018/0175149 A1\* 6/2018 Takaya .............. H01L 29/42368

\* cited by examiner

SEMICONDUCTOR DEVICE

CROSS-REFERENCE TO RELATED APPLICATION

This application claims priority to Japanese Patent Application No. 2017-047334 filed on Mar. 13, 2017, the entire contents of which are incorporated by reference herein.

BACKGROUND

Technical Field

The disclosure relates to a semiconductor device.

Related Art

A semiconductor device having a trench gate structure has been conventionally known (as described in, for example, a non-patent literature IEEE Electron Device Letters, Volume 37, No. 4, April 2016, p 463-466). The semiconductor device described in this non-patent literature provides a p-type semiconductor region from the vicinity of an outer periphery of a bottom face of a trench to between a drain electrode and a source electrode, for the purpose of improving the breakdown voltage of the semiconductor device.

The semiconductor device described in the above non-patent literature, however, has a problem of increasing the capacity between the drain and the source, due to the configuration that (i) a p/n interface is located below the trench and (ii) the p-type semiconductor region is arranged to entirely overlap with the source electrode in a stacking direction of semiconductor layers. There is accordingly a need for a technique that suppresses an increase in capacity between the drain and the source, while improving the breakdown voltage of the semiconductor device.

SUMMARY

In order to solve at least part of the problems described above, the disclosure may be implemented by aspects described below.

(1) According to one aspect of the present disclosure, there is provided a semiconductor device having a trench gate structure. This semiconductor device comprises a first n-type semiconductor layer configured to contain an n-type impurity; a p-type semiconductor layer configured to be formed on the first n-type semiconductor layer and configured to contain a p-type impurity and having a trench, the trench is configured to be recessed to pass through the p-type semiconductor layer and reaches the first n-type semiconductor layer; an insulating film configured to be arranged to cover a surface of the trench and configured to be made of an insulator; a gate electrode configured to be formed on the insulating film in the trench; a source electrode configured to be formed on a second n-type semiconductor layer provided on the p-type semiconductor layer; and a drain electrode configured to be formed on an opposite side to the p-type semiconductor layer across the first n-type semiconductor layer. The first n-type semiconductor layer includes a p-type impurity-containing region configured to contain a p-type impurity at a higher concentration than an n-type impurity. The p-type impurity-containing region is arranged to adjoin the p-type semiconductor layer. When viewed in a stacking direction of the first n-type semiconductor layer and the p-type semiconductor layer, the p-type impurity-containing region is provided at a position configured not to overlap with at least partly the source electrode and configured to overlap with an outer periphery of a bottom face of the trench. The semiconductor device of this aspect suppresses an increase in capacity between the drain and the source, while improving the breakdown voltage of the semiconductor device.

(2) In the semiconductor device of the above aspect, an average concentration of the p-type impurity in the p-type semiconductor layer at a position that overlaps with the p-type impurity-containing region in the stacking direction may be lower than an average concentration of the p-type impurity in the p-type semiconductor layer at a position that does not overlap with the p-type impurity-containing region when viewed in the stacking direction. The semiconductor device of this aspect increases the mobility of electron in the p-type semiconductor layer at the position overlapping with the p-type impurity-containing region in the stacking direction of the n-type semiconductor layer and the p-type semiconductor layer and thereby further reduces the on-resistance of the semiconductor device.

(3) In the semiconductor device of the above aspect, when Wdi represents a width of the p-type impurity-containing region overlapping with the trench in the stacking direction and Wt represents a width of the trench in the stacking direction, Wdi may be equal to or greater than twice a thickness of the insulating film and may be less than 2/3 times of Wt. The semiconductor device of this aspect further improves the breakdown voltage of the semiconductor device and further reduces the on-resistance without increasing the capacity between the drain and the source.

(4) In the semiconductor device of the above aspect, a surface of the p-type semiconductor layer that adjoins the source electrode may have a higher concentration of the p-type impurity than a concentration of the p-type impurity in a surface of the p-type semiconductor layer that adjoins the first n-type semiconductor layer. The semiconductor device of this aspect reduces the contact resistance between the p-type semiconductor layer and the source electrode.

(5) In the semiconductor device of the above aspect, the second n-type semiconductor layer may be a first n-type semiconductor region configured to be provided in the p-type semiconductor layer and contains the n-type impurity. The first n-type semiconductor region may be arranged to overlap with the outer periphery of the bottom face of the trench and with the p-type impurity-containing region when viewed in the stacking direction. The semiconductor device of this aspect suppresses an increase in capacity between the drain and the source, while improving the breakdown voltage of the semiconductor device.

(6) The semiconductor device of the above aspect may further comprise a second n-type semiconductor region configured to be arranged not to overlap with the outer periphery of the bottom face of the trench when viewed in the stacking direction and configured to have a lower concentration of the n-type impurity than a concentration of the n-type impurity in the first n-type semiconductor region. The semiconductor device of this aspect suppresses an increase in capacity between the drain and the source, while improving the breakdown voltage of the semiconductor device.

(7) In the semiconductor device of the above aspect, the first n-type semiconductor region may have a greater depth in the stacking direction than a depth of the second n-type semiconductor region. The semiconductor device of this aspect suppresses an increase in capacity between the drain and the source, while improving the breakdown voltage of the semiconductor device.

(8) In the semiconductor device of the above aspect, an average concentration of the p-type impurity in the p-type semiconductor layer at a position overlapping with the first n-type semiconductor region may be lower than an average concentration of the p-type impurity in the p-type semiconductor layer at a position overlapping with the second n-type semiconductor region. The semiconductor device of this aspect suppresses an increase in capacity between the drain and the source, while improving the breakdown voltage of the semiconductor device.

The disclosure may be implemented by any of various aspects other than the semiconductor device having the trench gate structure, for example, a manufacturing method of the semiconductor device having the trench gate structure or an apparatus for manufacturing the semiconductor device using the manufacturing method.

The semiconductor device according to any of the above aspects suppresses an increase in capacity between the drain and the source, while improving the breakdown voltage of the semiconductor device.

DESCRIPTION OF EMBODIMENTS

A. First Embodiment

A-1. Configuration of Semiconductor Device

Figure 1:
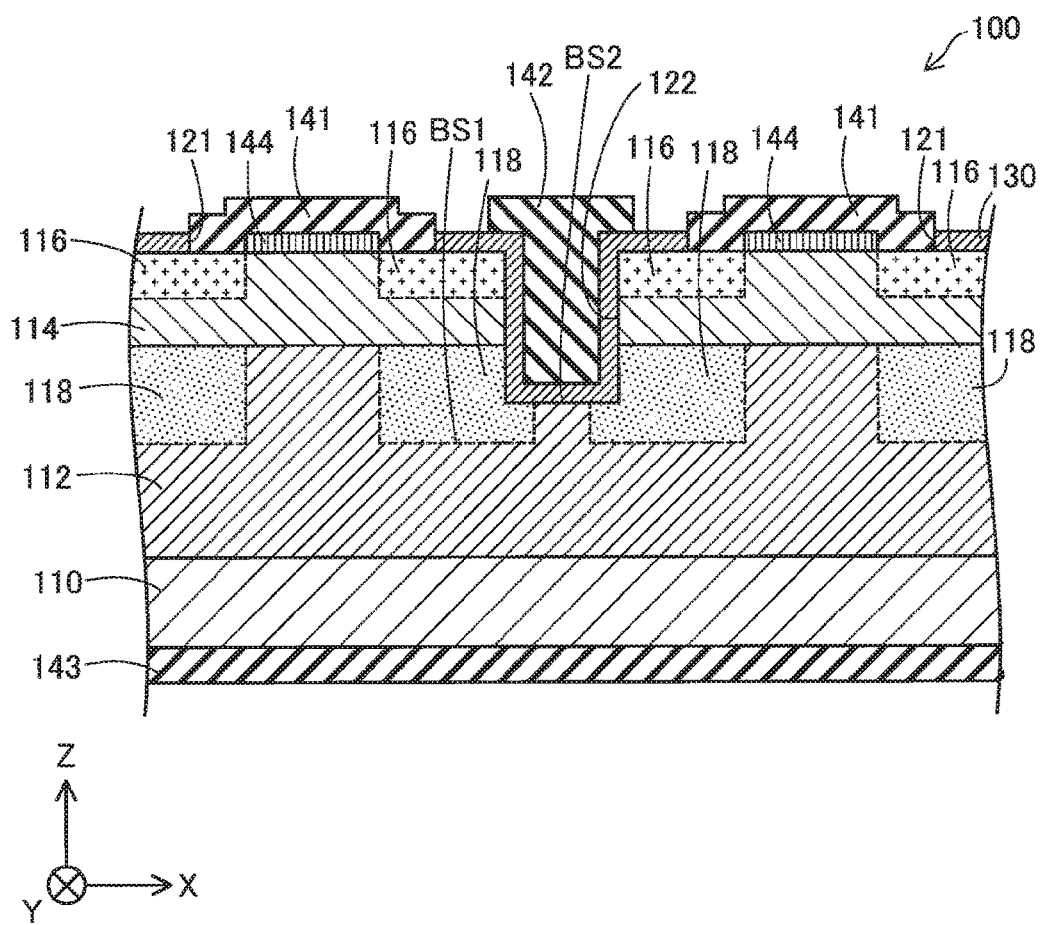
FIG. 1 is a cross-sectional view schematically illustrating the configuration of a semiconductor device according to a first embodiment.

FIG. 1 is a cross-sectional view schematically illustrating the configuration of a semiconductor device 100 according to a first embodiment. The semiconductor device 100 is a GaN-based semiconductor device formed by using gallium nitride (GaN). The semiconductor device 100 has a trench gate structure. In the description hereof, the "trench gate structure" denotes a structure that a trench is formed in a semiconductor layer and that at least part of a gate electrode is embedded in the trench. According to the embodiment, the semiconductor device 100 is a vertical trench MISFET (metal-insulator-semiconductor field-effect transistor). According to the embodiment, the semiconductor device 100 is used for power control and is also called power device.

X, Y and Z axes orthogonal to one another are illustrated in FIG. 1. Among the X, Y and Z axes shown in FIG. 1, the X axis is an axis extended from left to right of the sheet surface of FIG. 1. A +X-axis direction is a rightward direction of the sheet surface, and a −X-axis direction is a leftward direction of the sheet surface. Among the X, Y and Z axes shown in FIG. 1, the Y axis is an axis extended from front to back of the sheet surface of FIG. 1. A +Y-axis direction is a rearward direction of the sheet surface, and a −Y-axis direction is a forward direction of the sheet surface. Among the X, Y and Z axes shown in FIG. 1, the Z axis is an axis extended from bottom to top of the sheet surface of FIG. 1. A +Z-axis direction is an upward direction of the sheet surface, and a −Z-axis direction is a downward direction of the sheet surface.

The semiconductor device 100 includes a substrate 110, an n-type semiconductor layer 112, p-type impurity-containing regions 118, a p-type semiconductor layer 114, and n-type semiconductor regions 116. The semiconductor device 100 also includes an insulating film 130, source electrodes 141, body electrodes 144, a gate electrode 142, and a drain electrode 143 and has a trench 122. The substrate 110 and the n-type semiconductor layer 112 may be collectively called "first n-type semiconductor layer".

The substrate 110 of the semiconductor device 100 is a plate-like semiconductor extended along the X axis and the Y axis. According to the embodiment, the substrate 110, the n-type semiconductor layer 112 and the p-type semiconductor layer 114 are group III nitride semiconductors. Examples of the group III nitride semiconductor include gallium nitride (GaN), aluminum nitride (AlN), aluminum gallium nitride (AlGaN), indium gallium nitride (InGaN) and indium aluminum gallium nitride (InAlGaN). In terms of using the group III nitride semiconductor for the semiconductor device for power control, gallium nitride (GaN) and aluminum gallium nitride (AlGaN) are preferable as the group III nitride semiconductor. This embodiment uses gallium nitride (GaN) as the group III nitride semiconductor. Within a range that ensures the advantageous effects of the embodiment, the group III nitride semiconductor may include another group III element such as aluminum (Al) or indium (In) by substitution of part of gallium nitride (GaN) or may include another impurity According to the embodiment, the substrate 110 is an n-type semiconductor layer that contains silicon (Si) as an n-type impurity. According to the embodiment, the average value of silicon (Si) concentration in the substrate 110 is $1.0 \times 10^{18}$ $cm^{-3}$.

The n-type semiconductor layer 112 of the semiconductor device 100 is an n-type semiconductor layer that is located on a +Z-axis direction side of the substrate 110 and that is extended along the X axis and the Y axis. According to the embodiment, the n-type semiconductor layer 112 is an n-type semiconductor layer that contains silicon (Si) as an n-type impurity. According to the embodiment, the average value of silicon (Si) concentration in the n-type semiconductor layer 112 is lower than the average value of silicon (Si) concentration in the substrate 110 and is $1.0 \times 10^{16}$ $cm^{-3}$.

According to the embodiment, the n-type semiconductor layer 112 has a thickness (length in the Z-axis direction) of 10 μm.

The p-type impurity-containing regions 118 of the semiconductor device 100 are regions that are parts of a +Z-axis direction side of the n-type semiconductor layer 112 and that contain a p-type impurity at a higher concentration than an n-type impurity. It is preferable that the concentration of the p-type impurity in the p-type impurity-containing regions 118 is equal to or higher than $1.0 \times 10^{16}$ cm$^{-3}$. According to the embodiment, the p-type impurity-containing regions 118 contain silicon (Si) as the n-type impurity and also contain magnesium (Mg) as the p-type impurity.

The p-type impurity-containing regions 118 are arranged such that their upper surfaces (+Z-axis direction-side surfaces) adjoin the p-type semiconductor layer 114. The p-type impurity-containing regions 118 are regions that are located below the n-type semiconductor regions 116 and that are formed in an n-type semiconductor region forming process described later. This "below" arrangement herein means that the p-type impurity-containing regions 118 are located on the n-type semiconductor layer 112-side (−Z-axis direction side) of the p-type semiconductor layer 114 in the stacking direction (Z-axis direction) of the n-type semiconductor layer 112 and the p-type semiconductor layer 114 and that the p-type impurity-containing regions 118 are provided at positions overlapping with at least parts of the n-type semiconductor layer 112 and the p-type semiconductor layer 114 in the stacking direction (Z-axis direction). The p-type impurity-containing regions 118 have a thickness (length in the Z-axis direction) that is related to the thickness and the concentration of the n-type impurity of the n-type semiconductor regions 116. The p-type impurity-containing regions 118 are semiconductor regions that are extended along the X axis and the Y axis.

The p-type semiconductor layer 114 of the semiconductor device 100 is a semiconductor layer that is located above (on the +Z-axis direction side) of the n-type semiconductor layer 112 and that is extended along the X axis and the Y axis. According to the embodiment, the p-type semiconductor layer 114 is made of gallium nitride (GaN). According to the embodiment, the p-type semiconductor layer 114 is a p-type semiconductor layer that contains magnesium (Mg) as the p-type impurity. According to the embodiment, the average value of magnesium (Mg) concentration in the p-type semiconductor layer 114 is $2.0 \times 10^{18}$ cm$^{-3}$. The p-type semiconductor layer 114 has a thickness (length in the Z-axis direction) that is preferably not less than 0.5 μm in terms of more appropriate operation of the semiconductor device 100 as a transistor, is preferably not greater than 2.0 μm in terms of reduction of the on-resistance of the semiconductor device 100 and is 0.9 μm according to the embodiment.

The n-type semiconductor regions 116 of the semiconductor device are regions that are parts of a +Z-axis direction side of the p-type semiconductor layer 114 and that contain an n-type impurity. The n-type semiconductor regions 116 are semiconductor regions that are extended along the X axis and the Y axis. According to the embodiment, the n-type semiconductor regions 116 are made of gallium nitride (GaN). According to the embodiment, the n-type semiconductor regions 116 contain silicon (Si) as the n-type impurity. According to the embodiment, the n-type semiconductor regions 116 are regions formed by ion implantation of silicon (Si) into the parts of the +Z-axis direction side of the p-type semiconductor layer 114. The n-type semiconductor regions 116 are also called second n-type semiconductor layer. According to the embodiment, the second n-type semiconductor layer denotes the n-type semiconductor regions that are provided in the p-type semiconductor layer 114 and that contain the n-type impurity.

The trench 122 of the semiconductor device 100 is a grooved that is formed in the n-type semiconductor layer 112 and the p-type semiconductor layer 114 and that is recessed in the thickness direction (−Z-axis direction) of the n-type semiconductor layer 112. The trench 122 is recessed from the +Z-axis direction side of the p-type semiconductor layer 114 to pass through the p-type semiconductor layer 114 and reach the n-type semiconductor layer 112. According to the embodiment, the trench 122 is formed by dry etching in the n-type semiconductor layer 112 and the p-type semiconductor layer 114.

Figure 2:
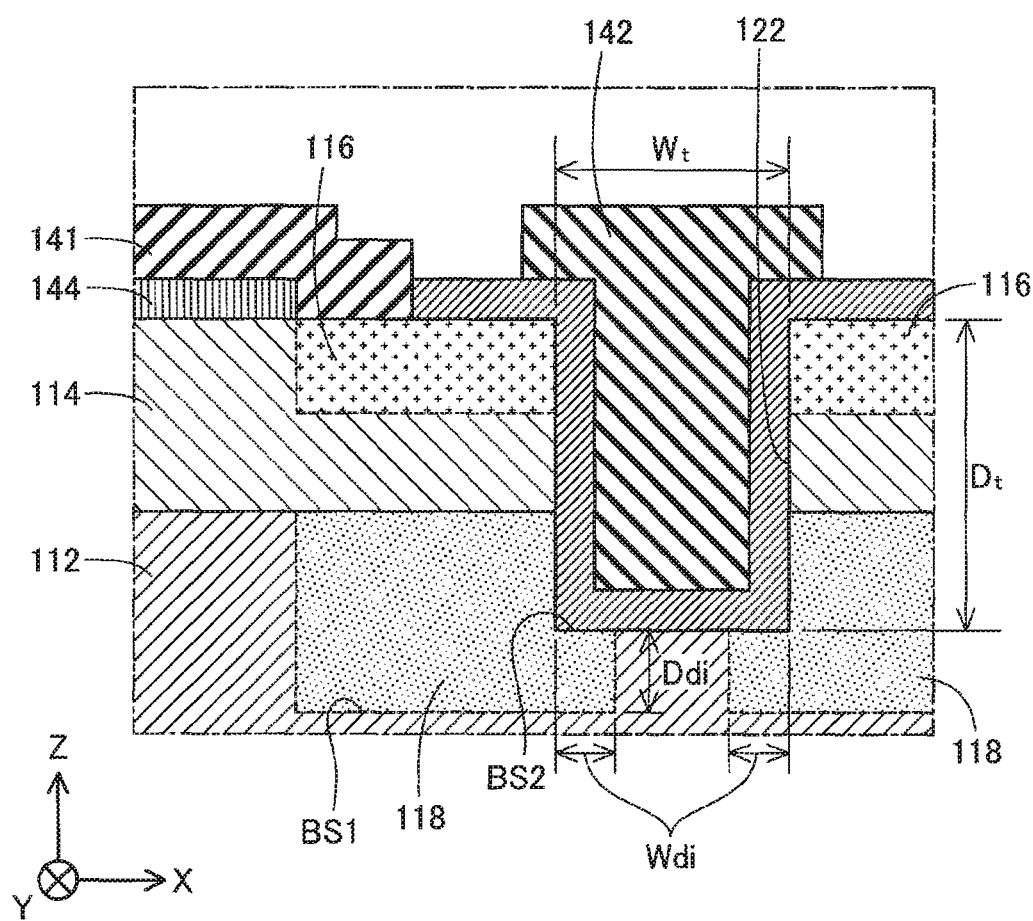
FIG. 2 is a schematic cross-sectional view illustrating a positional relationship between a trench and p-type impurity-containing regions.

FIG. 2 is a schematic cross-sectional view illustrating a positional relationship between the trench 122 and the p-type impurity-containing regions 118. In the stacking direction (Z-axis direction) of the n-type semiconductor layer 112 and the p-type semiconductor layer 114, bottom faces BS1 of the p-type impurity-containing regions 118 are located below (on the −Z-axis direction side of) a bottom face BS2 of the trench 122. The "bottom face BS1 of the p-type impurity-containing region 118" denotes a most −Z-direction side interface between the n-type semiconductor layer 112 and the p-type impurity-containing region 118. The "bottom face BS2 of the trench 122" denotes a most −Z-axis direction side surface of the trench 122.

Dt represents a depth of the trench 122 in the stacking direction (Z-axis direction), and Ddi represents a difference between the bottom face BS1 and the bottom face BS2 in the stacking direction (Z-axis direction). Wt represents a width of the trench 122 in the stacking direction (Z-axis direction), and Wdi represents a width of the p-type impurity-containing region 118 that overlaps with the trench 122 in the stacking direction (Z-axis direction). There are two overlapping portions of the p-type impurity-containing regions 118 with the trench 122 in the stacking direction (Z-axis direction) in the vicinity of the outer periphery of the bottom face BS2 of the trench 122. Wdi is the sum of these two overlapping portions. According to the embodiment Dt is 1.0 μm, Ddi is 0.3 μm, Wdi is 0.2 μm, and Wt is 2.0 μm.

It is preferable that Wt as the width of the trench 122 and Wdi as the total width of the overlapping portions of the p-type impurity-containing regions 118 with the trench 122 have relationships given below. The relationship of Wdi<Wt is preferable in terms of the operation of the semiconductor device 100 as a transistor, and the relationship of 0<Wdi is preferable in terms of improvement in breakdown voltage of the semiconductor device 100 with suppression of increase in capacity between the drain and the source. Wdi is preferably equal to or greater than twice the thickness of the insulating film 130 and is also preferably less than 2Wt/3. These relationships reduce the on-resistance of the semiconductor device 100. According to the embodiment, Wdi/Wt is 0.1.

This range of Wdi has the greater effect at the greater depth Dt of the trench 122. It is preferable that Dt as the depth of the trench 122 in the stacking direction (Z-axis direction) and Wdi as the total width of the overlapping portions of the p-type impurity-containing regions 118 with the trench 122 has a relationship given below. Wdi/(Wdi+2Dt) is preferably not less than 0.01 and not greater than 0.40 and is more preferably not less than 0.01 and not greater than 0.20. This relationship improves the breakdown voltage of the semiconductor device 100 and reduces the on-resistance of the semiconductor device 100, while suppressing an increase in capacity between the drain and the source. According to the embodiment, Wdi/(Wdi+2Dt) is 0.09.

The insulating film 130 of the semiconductor device 100 (shown in FIG. 1) is a film that is made of an insulator and has electrical insulating properties. The insulating film 130 is formed from inside to outside of the trench 122. Accordingly, the insulating film 130 is arranged to cover the surface of the trench 122. The insulating film 130 is formed on their +Z-axis direction sides of the n-type semiconductor regions 116, in addition to inside of the trench 122. According to the embodiment, the insulating film 130 is made of silicon dioxide ($SiO_2$). According to the embodiment, the insulating film 130 is a film formed by atomic layer deposition (ALD). According to the embodiment, the insulating film 130 has a thickness of 0.1 μm.

The insulating film 130 has contact holes 121. The contact holes 121 are through holes arranged to pass through the insulating film 130 and reach the p-type semiconductor layer 114. According to the embodiment, the contact holes 121 are formed by wet etching in the insulating film 130.

The body electrodes 144 of the semiconductor device 100 are electrodes formed in the contact holes 121 of the insulating film 130. According to the embodiment, the body electrodes 144 are arranged to adjoin the p-type semiconductor layer 114. The body electrodes 144 are in ohmic contact with the p-type semiconductor layer 114. The ohmic contact herein is not Schottky contact and means a contact of relatively low contact resistance. According to the embodiment, the body electrodes 144 are electrodes that are made of palladium (Pd) and that are subjected to annealing (heat treatment) after formation on the semiconductor layer.

The source electrodes 141 of the semiconductor device 100 are electrodes that are formed in the contact holes 121 of the insulating film 130. According to the embodiment, the source electrode 141 is formed on the body electrode 144 and on the n-type semiconductor region 116 of the p-type semiconductor layer 114. The source electrode 141 is in ohmic contact with the n-type semiconductor region 116. According to the embodiment, the source electrodes 141 are electrodes that are subjected to annealing (heat treatment) after stacking of a layer made of aluminum (Al) on a layer made of titanium (Ti). According to the embodiment, the source electrode 141 and the body electrode 144 are electrically in contact with each other, so that a voltage of an identical potential is applicable to the source electrode 141 and the body electrode 144. The source electrodes 141 may be made of palladium (Pd). Making the source electrodes 141 and the body electrodes 144 of the same metal enables the source electrodes 141 and the body electrodes 144 to be formed in one identical process.

The drain electrode 143 of the semiconductor device 100 is an electrode that is formed on the opposite side to the p-type semiconductor layer 114 across the n-type semiconductor layers 110 and 112. According to the embodiment, the drain electrode 143 is an electrode that is formed below (on the −Z-axis direction side of) the substrate 110. The drain electrode 143 is in ohmic contact with the substrate 110. According to the embodiment, the drain electrode 143 is an electrode that is subjected to annealing (heat treatment) after stacking of a layer made of aluminum (Al) on a layer made of titanium (Ti).

The gate electrode 142 of the semiconductor device 100 is an electrode that is formed in the trench 122 via the insulating film 130. According to the embodiment, the gate electrode 142 is made of aluminum (Al). When a voltage is applied to the gate electrode 142, an inversion layer is formed in the p-type semiconductor layer 114. This inversion layer serves as a channel, so that an electrical conduction pathway is formed between the source electrode 141 and the drain electrode 143. Accordingly, the electric current flowing between the source electrode 141 and the drain electrode 143 across the substrate 110, the n-type semiconductor layer 112 and the p-type semiconductor layer 114 is controlled by applying a voltage to the gate electrode 142.

A-2. Advantageous Effects

In the semiconductor device 100 of the first embodiment, the p-type impurity-containing region 118 is provided at the position that overlaps with the outer periphery of the bottom face BS2 of the trench 122 in the stacking direction (Z-axis direction) of the n-type semiconductor layer 112 and the p-type semiconductor layer 114. The configuration of the semiconductor device 100 of the first embodiment accordingly suppresses potential crowding in the vicinity of the outer periphery of the bottom face of the trench 122 and thereby improves the breakdown voltage of the semiconductor device 100.

Additionally, in the semiconductor device 100 of the first embodiment, the p-type impurity-containing region 118 is provided at the position that does not at least partly overlap with part of the source electrode 141 in the stacking direction (Z-axis direction) of the n-type semiconductor layer 112 and the p-type semiconductor layer 114. According to the embodiment, the p-type impurity-containing region 118 is provided at the position that does not partly overlap with the source electrode 141 in the stacking direction (Z-axis direction) of the n-type semiconductor layer 112 and the p-type semiconductor layer 114. Compared with a configuration that the p-type impurity-containing region 118 is provided at a position that entirely overlaps with the source electrode in the stacking direction (Z-axis direction), the configuration of the semiconductor device 100 of the first embodiment suppresses an increase in capacity between the drain electrode 143 and the source electrode 141. As a result, this increases the switching speed.

Furthermore, in the semiconductor device 100 of the first embodiment, the p-type impurity-containing region 118 is arranged to adjoin the p-type semiconductor layer 114. In a heat treatment process performed to activate magnesium (Mg) as the p-type impurity included in the p-type semiconductor layer 114, magnesium (Mg) as the p-type impurity included in the p-type impurity-containing regions 118 is also activated. Accordingly, in this process, hydrogen included in the p-type impurity-containing region 118 is discharged through the p-type semiconductor layer 114 to outside. This configuration facilitates manufacture of the semiconductor device 100 of the first embodiment.

A-3. Manufacturing Method of Semiconductor Device

Figure 3:
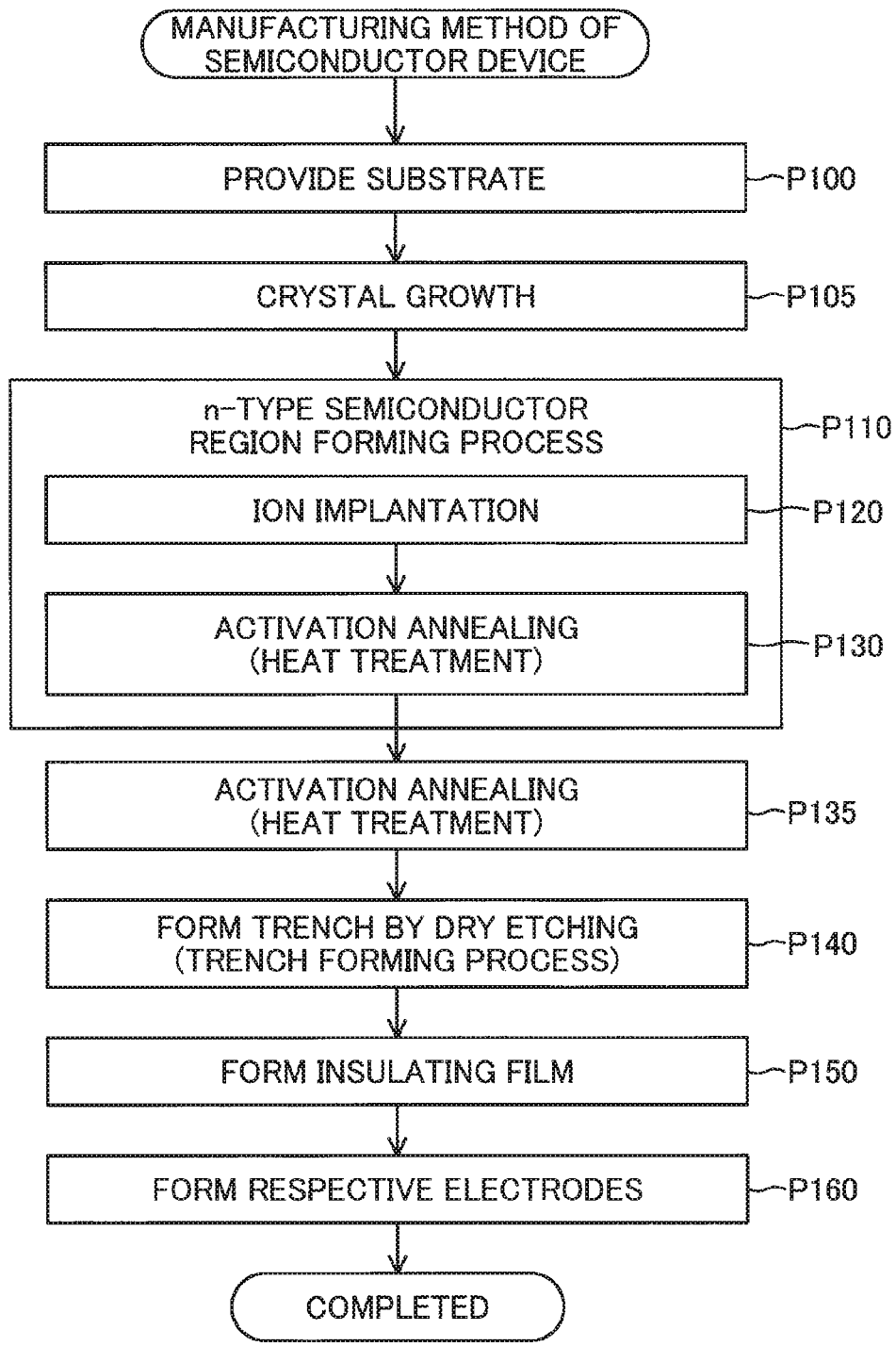
FIG. 3 is a process chart showing a manufacturing method of the semiconductor device according to the first embodiment.

FIG. 3 is a process chart showing a manufacturing method of the semiconductor device 100 according to the first embodiment. The manufacturer first provides the substrate 110 (process P100). According to the embodiment, the substrate 110 is made of gallium nitride (GaN).

The manufacturer subsequently performs crystal growth (process P105). More specifically, the manufacturer (i) grows the n-type semiconductor layer 112 on the substrate 110 and (ii) grows the p-type semiconductor layer 114 on the n-type semiconductor layer 112. According to the embodiment, the manufacturer employs metal organic chemical vapor deposition (MOCVD) as the technique of crystal growth.

According to the embodiment, the substrate 110 and the n-type semiconductor layer 112 are n-type semiconductors that contain silicon (Si) as a donor element. The p-type semiconductor layer 114 is a p-type semiconductor that contains magnesium (Mg) as an acceptor element.

After the process P105, the manufacturer forms the n-type semiconductor regions 116 in parts of the p-type semiconductor layer 114 (process P110). The process P110 is called n-type semiconductor region forming process. The n-type semiconductor region forming process (process P110) includes an ion implantation process (process P120) and a heat treatment process (process P130).

The manufacturer implants the n-type impurity from above the p-type semiconductor layer 114 (process P120). According to the embodiment, the manufacturer implants silicon (Si) as the n-type impurity into the p-type semiconductor layer 114.

More specifically, the manufacturer first forms a film 210 on the p-type semiconductor layer 114. The film 210 is used to adjust the distribution of the impurity that is implanted by ion implantation, in the depth direction of the p-type semiconductor layer 114. More specifically, the film 210 is used to collect the donor element that is implanted into the p-type semiconductor layer 114, to the vicinity of the surface of the p-type semiconductor layer 114. The film 210 also serves to prevent the surface of the p-type semiconductor layer 114 from being damaged by ion implantation. According to the embodiment, the film 210 used is a silicon dioxide ($SiO_2$) film having a film thickness of 30 nm. According to the embodiment, the manufacturer forms the film 210 by plasma CVD (chemical vapor deposition).

The manufacturer subsequently forms a mask 220 on part of the film 210. The mask 220 is formed on regions of the p-type semiconductor layer 114 without implantation of the donor element. According to the embodiment, the configuration of the mask 220 is determined by taking into account the positions of ohmic contact of the source electrodes 141 with the n-type semiconductor regions 116 and the positions of formation of the p-type impurity-containing regions 118. According to the embodiment, the mask 220 is formed at a position where ion implantation is performed in part of an area to form the trench 122. According to the embodiment, the manufacturer forms the mask 220 by photoresist. According to the embodiment, the mask 220 has a film thickness of approximately 2 μm.

The manufacturer subsequently performs ion implantation from above the p-type semiconductor layer 114. According to the embodiment, the manufacturer implants silicon (Si) into the p-type semiconductor layer 114. In the process of ion implantation, the total dose is preferably equal to or higher than $5.0 \times 10^{14}$ cm$^{-2}$. According to the embodiment, the total dose of ion implantation is $1.0 \times 10^{15}$ cm$^{-2}$. In the process of ion implantation, it is preferable that the manufacture regulates an accelerating voltage, such that the concentration of silicon in a region from a +Z-axis direction side surface of the p-type semiconductor layer 114 to the depth of 0.1 μm is $1.0 \times 10^{19}$ cm$^{-3}$. The frequency of ion implantation may be once or may be multiple times. In terms of suppressing the channeling effect in the ion implantation process, the angle of ion implantation is preferable not less than 5 degrees and not greater than 15 degrees relative to the Z-axis direction. According to the embodiment, the angle of ion implantation is 9 degrees. The temperature of the semiconductor substrate 110 in the ion implantation process is preferably not lower than 20° C. and not higher than 800° C. According to the embodiment, the temperature is 25° C. According to the embodiment, the following conditions are employed for ion implantation:

<Conditions of Ion Implantation>
First Time
   Accelerating voltage: 50 keV
   Dose: $5.0 \times 10^{14}$ cm$^{-2}$
   Angle of implantation: 9 degrees
   Temperature: 25° C.
Second Time
   Accelerating voltage: 100 keV
   Dose: $5.0 \times 10^{14}$ cm$^{-2}$
   Angle of implantation: 9 degrees
   Temperature: 25° C.

Figure 4:
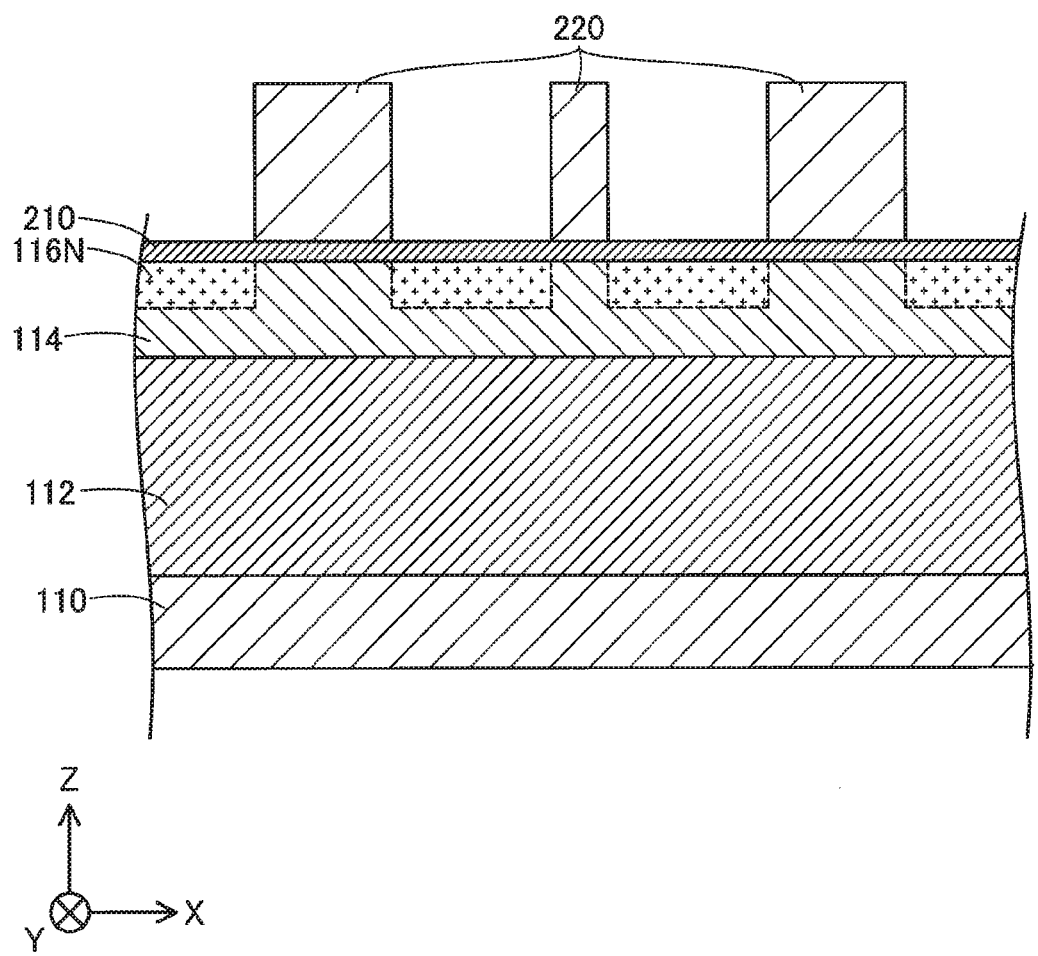
FIG. 4 is a cross-sectional view schematically illustrating a state of ion implantation.

FIG. 4 is a cross-sectional view schematically illustrating the process of ion implantation. In the ion implantation process (process P120), ion implantation regions 116N are formed below portions of the film 210 that are not covered with the mask 220, as regions where the donor element is implanted into the p-type semiconductor layer 114. The concentration of the n-type impurity in the ion implantation regions 116N may be adjusted to a desired concentration by regulating the material and the film thickness of the film 210 and the accelerating voltage and the dose of ion implantation. The ion implantation regions 116N do not have n-type electrical conductivity since the implanted n-type impurity is not activated to function as the donor element. Accordingly, the ion implantation regions 116N are regions of high resistance.

The manufacturer subsequently removes the film 210 and the mask 220. According to the embodiment, the manufacturer removes the film 210 and the mask 220 by wet etching. This completes ion implantation (process P120 (shown in FIG. 3)).

The concentration of silicon in the ion implantation regions 116N is preferably higher than the concentration of magnesium in the p-type semiconductor layer 114, is more preferably equal to or higher than twice the concentration of magnesium in the p-type semiconductor layer 114, is furthermore preferably equal to or higher than four times the concentration of magnesium in the p-type semiconductor layer 114, and is especially preferably equal to or higher than five times the concentration of magnesium in the p-type semiconductor layer 114. The concentration of silicon in the ion implantation regions 116N is preferably not higher than $1.0 \times 10^{22}$ cm$^{-3}$ in terms of suppression of deterioration of the crystallinity in the p-type semiconductor layer 114.

After the ion implantation (process P120), the manufacturer performs activation annealing (heat treatment) to activate the n-type impurity in the ion implantation regions 116N (process P130). In the process P130, the manufacturer heats the ion implantation regions 116N to form the n-type semiconductor regions 116 having the n-type electrical conductivity. More specifically, the manufacturer first forms a cap film 240 on the p-type semiconductor layer 114 and the ion implantation regions 116N.

The cap film 240 serves to prevent the surface of the p-type semiconductor layer 114 and the ion implantation regions 116N from being damaged by heating and also serves to suppress nitrogen (N) from coming out of the p-type semiconductor layer 114. According to the embodiment, the manufacturer forms the cap film 240 by sputtering. According to the embodiment, the cap film 240 is made of silicon nitride (SiNx) and has a thickness (length in the Z-axis direction) of 50 nm.

The manufacturer subsequently heats the p-type semiconductor layer 114 and the ion implantation regions 116N. The temperature of heating the p-type semiconductor layer 114 and the ion implantation regions 116N is preferably not lower than 950° C. and not higher than 1400° C. and is more preferably not lower than 1050° C. and not higher than 1250° C., in terms of further improvement in breakdown voltage of the semiconductor device 100. The heating time is preferably not shorter than 1 minute and not longer than 10 minutes and is more preferably not shorter than 1 minute and not longer than 5 minutes, in terms of further improvement of the breakdown voltage of the semiconductor device 100. According to the embodiment, the manufacturer employs the following conditions for heat treatment:

<Conditions of Heat Treatment>

Atmosphere gas: nitrogen

Heating temperature: 1150° C.

Heating time: 4 minutes

Figure 5:
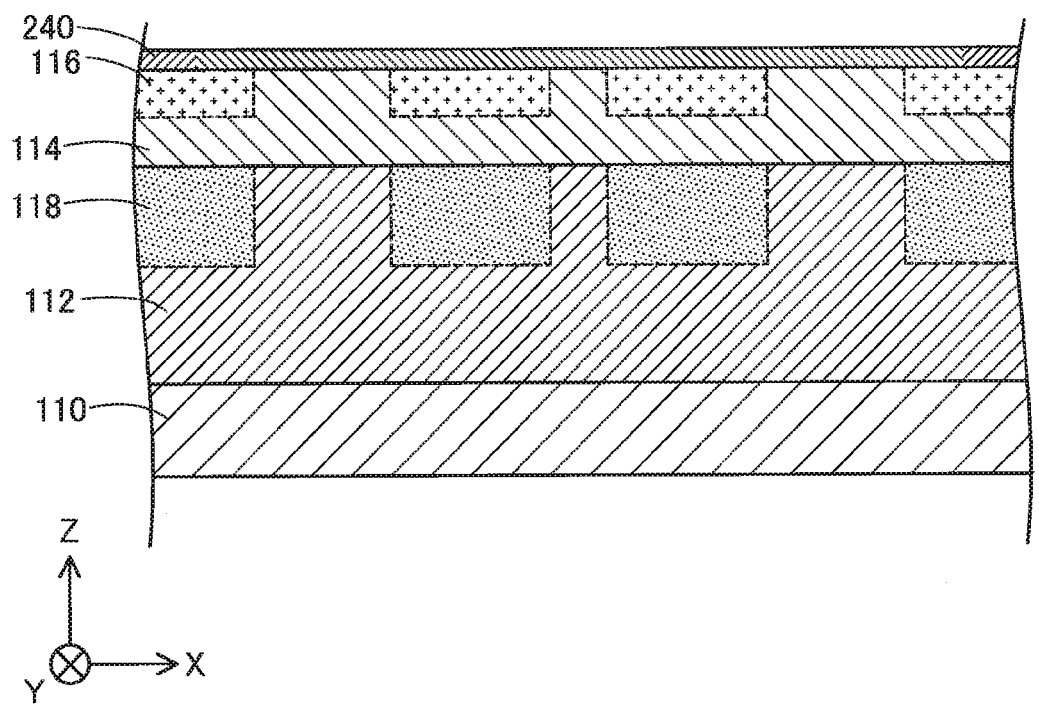
FIG. 5 is a cross-sectional view schematically illustrating a state after heat treatment.

FIG. 5 is a cross-sectional view schematically illustrating the state after heat treatment. The ion implantation regions 116N are changed to the n-type semiconductor regions 116 by heat treatment. The p-type impurity-containing regions 118 are formed as the regions that are located below the n-type semiconductor regions 116 and that are the +Z-axis direction side of the n-type semiconductor layer 112, through ion implantation (process P120) and heat treatment (process P130), i.e., through the n-type semiconductor region forming process (process P110). The p-type impurity-containing regions 118 are regions formed by diffusion of the p-type impurity that is included in the p-type semiconductor layer 114, into the n-type semiconductor layer 112. According to the embodiment, the p-type impurity-containing regions 118 are provided at the positions overlapping with the n-type semiconductor regions 116 in the stacking direction (Z-axis direction).

The concentration of the p-type impurity included in the p-type impurity-containing regions 118 may be adjusted by regulating the accelerating voltage and the dose in ion implantation (process P120) and the heating temperature and the heating time in heat treatment (process P130). For example, the concentration of the p-type impurity diffused in the p-type impurity-containing regions 118 may be increased by increasing the accelerating voltage or increasing the dose in ion implantation (process P120).

After heat treatment, the manufacturer removes the cap film 240 from above the p-type semiconductor layer 114 and the ion implantation regions 116N (n-type semiconductor regions 116). According to the embodiment, the manufacturer removes the cap film 240 by wet etching. This completes activation annealing (process P130 (shown in FIG. 3)) and simultaneously completes the n-type semiconductor region forming process (process P110).

After the n-type semiconductor region forming process (process P110 (shown in FIG. 3)), the manufacturer performs activation annealing (heat treatment) to activate magnesium (Mg) in the p-type semiconductor layer 113 and the p-type impurity-containing regions 118 (process P135). According to the embodiment, heat treatment is performed at 700° C. for 5 minutes in a nitrogen atmosphere having a ratio of the flow rate of oxygen ($O_2$) to the flow rate of nitrogen ($N_2$) equal to 5%. The conditions of heat treatment are, however, not limited to these conditions, but for example, heat treatment may be performed at 900° C. for 10 minutes in a nitrogen atmosphere without including oxygen ($O_2$). Activation annealing (heat treatment) to activate magnesium (Mg) included in the p-type impurity-containing regions 114 may be preformed after formation of the p-type semiconductor layer 114 (process P105) and before the n-type semiconductor region forming process (process P110).

After activation annealing (process P135), the manufacturer forms the trench 122 by dry etching (process P140). The process P145 is called trench forming process.

Figure 6:
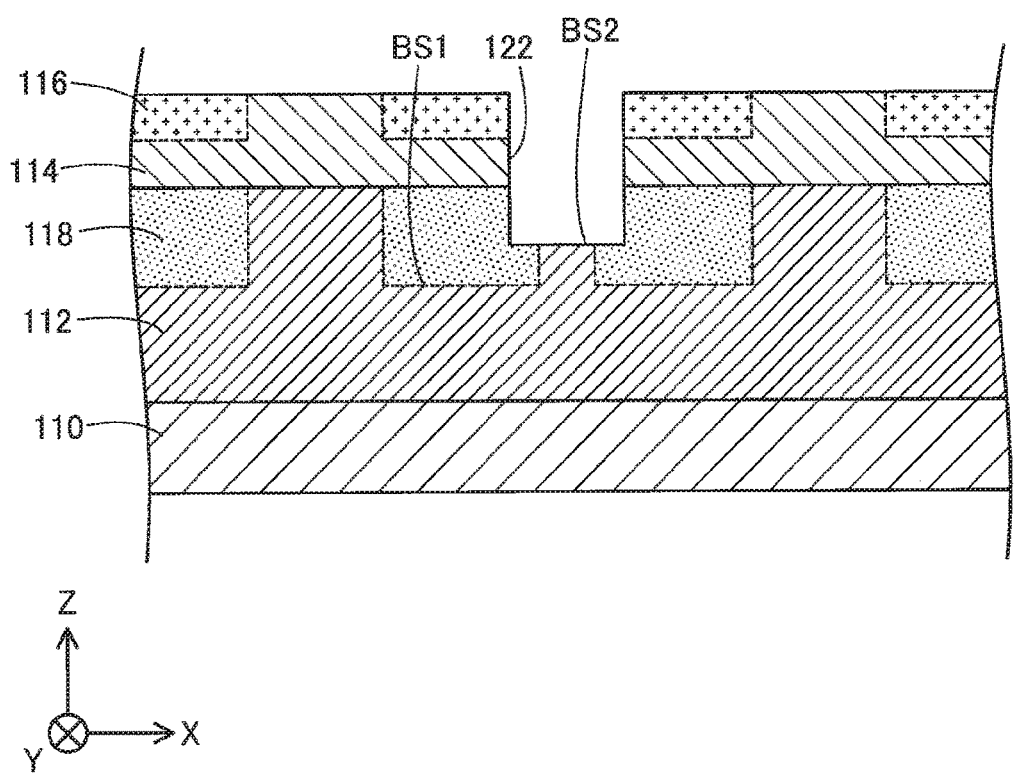
FIG. 6 is a cross-sectional view schematically illustrating a state after formation of a trench.

FIG. 6 is a cross-sectional view schematically illustrating the state after formation of the trench 122. The manufacturer forms the trench 122 that is recessed to pass through the p-type semiconductor layer 114 and reach the n-type semiconductor layer 112. According to the embodiment, the manufacturer forms the trench 122 by dry etching using a chlorine-based gas.

According to the embodiment, the trench forming process (process P140) is performed after the n-type semiconductor region forming process (process P110). The trench forming process (process P140) forms the trench 122 at a position that partly overlaps with the p-type impurity-containing regions 118. Accordingly, part of the bottom face BS2 of the trench 122 is formed by the p-type impurity-containing regions 118. The p-type impurity-containing regions 118 are provided at the positions overlapping with the outer periphery of the bottom face BS2 of the trench in the stacking direction (Z-axis direction) of the n-type semiconductor layer 112 and the p-type semiconductor layer 114.

After formation of the trench 122 (process P140 (shown in FIG. 3)), the manufacturer forms the insulating film 130 inside of the trench 122 (process P150). According to the embodiment, the manufacturer forms the insulating film 130 on the exposed surface of the n-type semiconductor layer 112 and the p-type semiconductor layer 114 by ALD.

The manufacturer subsequently forms the source electrodes 141, the body electrodes 144, the gate electrode 142 and the drain electrode 143 (process P160). More specifically, the manufacturer forms the contact holes 121 (shown in FIG. 1) in the insulating film 130 by wet etching. The manufacturer subsequently forms the body electrode 144 in the contact hole 121 to adjoin the p-type semiconductor layer 114, and forms the source electrode 141 on the n-type semiconductor regions 116 and the body electrode 144. The manufacturer also forms the drain electrode 143 to adjoin a lower surface (−Z-axis direction side surface) of the substrate 110. The process of forming the body electrodes 144, the source electrodes 141 and the drain electrode 143 performs annealing process (heat treatment) to provide the ohmic contact. The annealing process (heat treatment) may be performed after formation of each of the electrodes or may be performed collectively for the body electrodes 144 and the source electrodes 141. The annealing process (heat treatment) may otherwise be performed collectively after formation of the body electrodes 144, the source electrodes 141 and the drain electrode 143. The manufacturer subsequently forms the gate electrode 142 on the insulating film 130 in the trench 122. The semiconductor device 100 is completed through this series of processes.

The manufacturing method of the semiconductor device 100 according to the first embodiment forms the p-type impurity-containing regions 118 in the n-type semiconductor region forming process (process P110) without ion implantation of the p-type impurity. Accordingly, the manufacturing method of the semiconductor device 100 according to the first embodiment suppresses potential crowding in the vicinity of the outer periphery of the bottom face BS2 of the trench 122. As a result, the manufacturing method of the semiconductor device 100 according to the first embodiment improves the breakdown voltage of the semiconductor device 100.

In the manufacturing method of the semiconductor device 100 according to the first embodiment, part of the bottom face BS2 of the trench 122 is formed by the p-type impurity-containing regions 118. Accordingly, the manufacturing method of the semiconductor device 100 according to the first embodiment more effectively suppresses potential crowding in the vicinity of the outer periphery of the bottom face BS2 of the trench 122.

The manufacturing method of the semiconductor device 100 according to the first embodiment does not perform ion implantation of the p-type impurity and accordingly suppresses the disturbance of the crystal structure caused by ion implantation of the p-type impurity.

The manufacturing method of the semiconductor device 100 according to the first embodiment does not form the p-type impurity-containing regions 118 by regrowth and thereby eliminates the problem of impurity on a regrowth interface that arises in the regrowth process. Compared with a configuration of forming the p-type impurity-containing regions by regrowth, the manufacturing method of the semiconductor device 100 according to the first embodiment suppresses the disturbance of the crystal structure in the p-type impurity-containing regions 118. Additionally, compared with the configuration of forming the p-type impurity-containing regions by regrowth, the manufacturing method of the semiconductor device 100 according to the first embodiment reduces the number of processes, for example, formation of a resist pattern.

The following describes the results of evaluation tests supporting the advantageous effects described above.

A-4. Evaluation Tests

A-4-1. First Evaluation Test

A first evaluation test evaluated a relationship between ion implantation of the n-type impurity and formation of the p-type impurity-containing regions 118. The following samples were used in the first evaluation test. More specifically, the examiner provided the substrate 110 (process P100) and performed crystal growth (process P105) by the same method as that of the first embodiment described above. The examiner subsequently formed a p+-type semiconductor layer having the magnesium (Mg) concentration of $1 \times 10^{19}$ cm$^{-3}$ and the thickness of 0.1 µm. The examiner then performed ion implantation (process P120) and heat treatment (process P130) by the same method as that of the first embodiment.

Figure 7:
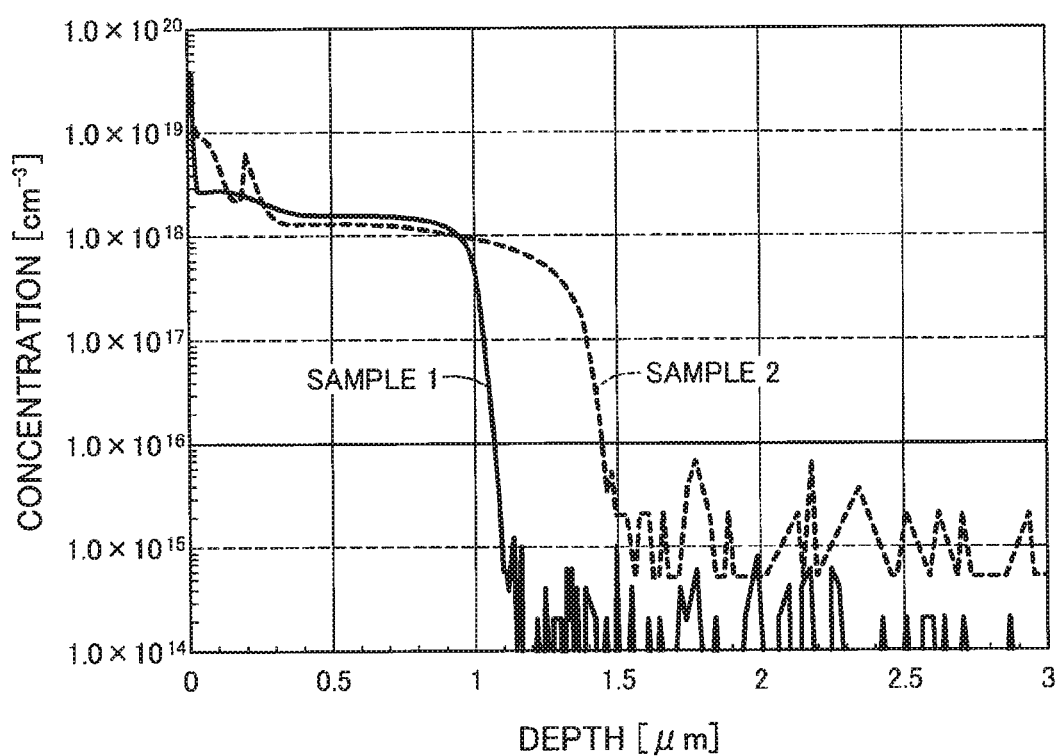
FIG. 7 is a graph showing results of a first evaluation test.

FIG. 7 is a graph showing the results of the first evaluation test. FIG. 7 shows the results of measurement of the concentration of magnesium (Mg) as impurity by secondary ion mass spectrometry (SIMS). In the graph of FIG. 7, the abscissa shows the depth (µm) in the −Z-axis direction of the p+-type semiconductor layer, the p-type semiconductor layer 114 and the n-type semiconductor layer 112, and the ordinate shows the concentration (cm$^{-3}$) of magnesium (Mg). The depth of 0 µm denotes a +Z-axis direction side surface of the p+-type semiconductor layer. The detection lower limit of magnesium (Mg) in this test is $5 \times 10^{14}$ cm$^{-3}$.

In the graph of FIG. 7, the plot of a sample 1 shows the concentration (cm$^{-3}$) of magnesium in the thickness direction (Z-axis direction) in a region without ion implantation, and the plot of a sample 2 shows the concentration (cm$^{-3}$) of magnesium in the thickness direction (Z-axis direction) in a region with ion implantation.

The results of FIG. 7 show the following. A region having the magnesium concentration of not lower than $1.0 \times 10^{16}$ cm$^{-3}$ is a region to the depth of approximately 1.1 µm in the sample 1 and is a region to the depth of approximately 1.4 µm in the sample 2. The region to the depth of 1.1 µm is a region of a p-type semiconductor layer including a p+-type semiconductor layer. This shows that the p-type impurity-containing region 118 is formed in thickness of approximately 0.3 µm in the sample 2. More specifically, this result shows that the region having the thickness of approximately 0.3 µm is formed as the p-type impurity-containing region 118 from the depth of approximately 1.1 µm that is the boundary between the n-type semiconductor layer 112 and the p-type semiconductor layer 114. In the sample 2, the concentration of magnesium abruptly decreases from the depth of approximately 1.4 µm. This concentration distribution is not a gauss distribution but is a box-like distribution.

According to the results shown in FIG. 7, the average concentration of magnesium in a range of the depth of 0.3 µm to 0.9 µm in the sample 2 is lower than the average concentration of magnesium in the range of the depth of 0.3 µm to 0.9 µm in the sample 1. This shows that the average concentration of the p-type impurity in the p-type semiconductor layer 114 at the position that overlaps with the p-type impurity-containing region 118 is lower than the average concentration of the p-type impurity in the p-type semiconductor layer 114 at the position that does not overlap with the p-type impurity-containing region 118, in the stacking direction of the n-type semiconductor layer 112 and the p-type semiconductor layer 114. This configuration increases the mobility of electron in the p-type semiconductor layer 114 at the position that overlaps with the p-type impurity-containing region 118 in the stacking direction of the n-type semiconductor layer 112 and the p-type semiconductor layer 114 and thereby decreases the on-resistance.

A p-type impurity sheet concentration X1 (cm$^{-2}$) of the p-type impurity from the depth of 0 µm to 1.1 µm of the sample 1 accumulated by using the results shown in FIG. 7 is substantially equal to a p-type impurity sheet concentration X2 of the p-type impurity from the depth of 0 µm to 1.4 µm of the sample 2. The expression of "substantially equal" herein means that the p-type impurity sheet concentration X2 is within ±10% of the p-type impurity sheet concentration X1. This leads to the presumption that the p-type impurity present in the p-type semiconductor layer 114 is pressed into the n-type semiconductor layer 112 by ion implantation (process P120 (shown in FIG. 3)) to form the p-type impurity-containing region 118.

A-4-2. Second Evaluation Test

A second evaluation test evaluated the effect of a change in dose of silicon (Si) in ion implantation (process P120 (shown in FIG. 3)) on the depth of the p-type impurity-containing region 118. In the second evaluation test, the examiner provided a sample 3 and a sample 4 having different conditions of ion implantation. More specifically, the examiner sequentially formed an n-type gallium nitride layer (concentration of silicon: $1.0 \times 10^{16}$ cm$^{-3}$, thickness: 1 µm) and a p-type gallium nitride layer (concentration of magnesium: $4.0 \times 10^{18}$ cm$^{-3}$, thickness: 1 µm) by crystal growth on a gallium nitride (GaN) substrate (concentration of silicon: $1.0 \times 10^{18}$ cm$^{-3}$). The examiner subsequently performed the manufacturing process to activation annealing (process P130) by the same method as that of the first embodiment except the conditions of ion implantation to manufacture the samples. The following shows the conditions of ion implantation employed for the sample 3 and the sample 4:

<Conditions of Ion Implantation in Sample 3>

First Time

Accelerating voltage: 50 keV

Dose: $5.0 \times 10^{14}$ cm$^{-2}$

Angle of implantation: 9 degrees

Temperature: 25° C.

Second Time
    Accelerating voltage: 100 keV
    Dose: $5.0 \times 10^{14}$ cm$^{-2}$
    Angle of implantation: 9 degrees
    Temperature: 25° C.
<Conditions of Ion Implantation in Sample 4>
First Time
    Accelerating voltage: 50 keV
    Dose: $1.0 \times 10^{15}$ cm$^{-2}$
    Angle of implantation: 9 degrees
    Temperature: 25° C.
Second Time
    Accelerating voltage: 100 keV
    Dose: $1.0 \times 10^{15}$ cm$^{-2}$
    Angle of implantation: 9 degrees
    Temperature: 25° C.

Figure 8:
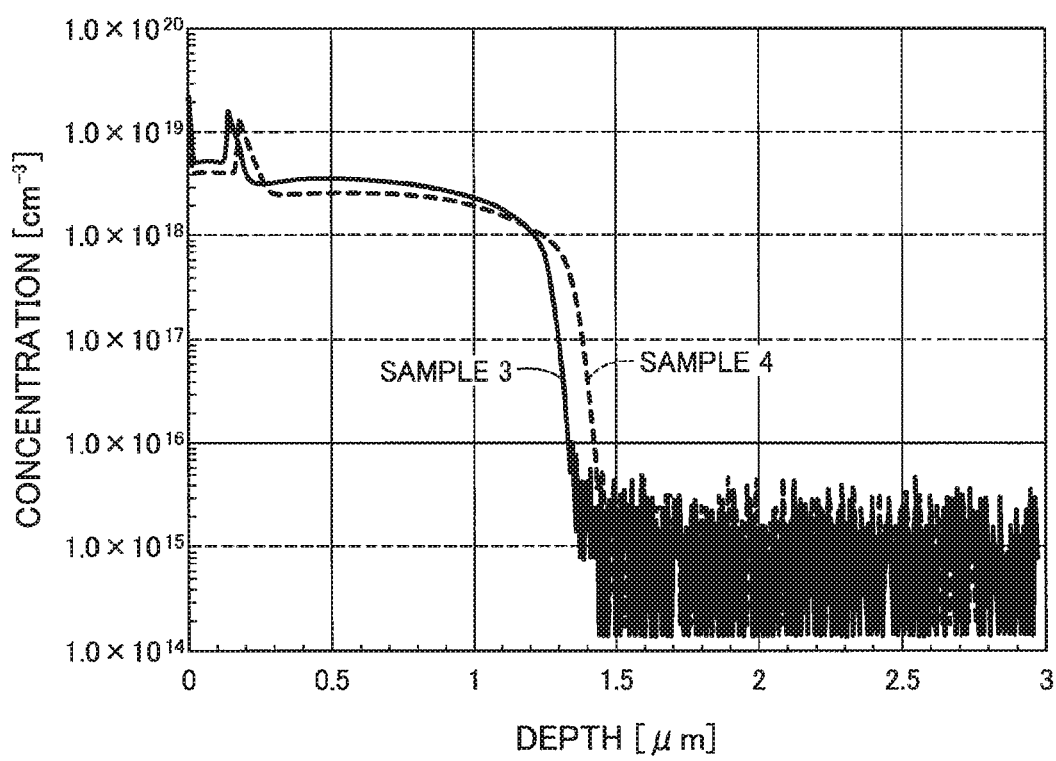
FIG. 8 is a graph showing results of a second evaluation test.

FIG. 8 is a graph showing the results of the second evaluation test. FIG. 8 shows the results of measurement of the concentration of magnesium (Mg) as impurity in the p-type semiconductor layer 114 and in the n-type semiconductor layer 112 of each sample by secondary ion mass spectrometry (SIMS). In the graph of FIG. 8, the abscissa shows the depth (μm) in the −Z-axis direction of the p-type semiconductor layer and the n-type semiconductor layer, and the ordinate shows the concentration (cm$^{-3}$) of magnesium (Mg). The depth of 0 μm denotes a +Z-axis direction side surface of the p-type semiconductor layer. The detection lower limit of magnesium (Mg) in this test is $5 \times 10^{14}$ cm$^{-3}$.

The results of FIG. 8 show the following. A region having the magnesium concentration of not lower than $1.0 \times 10^{16}$ cm$^{-3}$ is a region to the depth of approximately 1.3 μm in the sample 3 and is a region to the depth of approximately 1.4 μm in the sample 4. The region to the depth of 1.0 μm is a region of a p-type semiconductor layer. This shows that the p-type impurity-containing region 118 is formed in thickness of approximately 0.3 μm in the sample 3 and that the p-type impurity-containing region 118 is formed in thickness of approximately 0.4 μm in the sample 4. The sample 4 has a greater dose in ion implantation than the sample 3. The results of FIG. 8 accordingly show that the thickness of the p-type impurity-containing region 118 increases with an increase in dose in ion implantation.

A-4-3. Third Evaluation Test

A third evaluation test evaluated the effect of activation annealing (process P130) after ion implantation (process P120 (shown in FIG. 3)) on the p-type impurity containing region 118. In the third evaluation test, the examiner provided a sample 5 and a sample 6. The examiner manufactured the samples by the same method as that of the second evaluation test except the conditions of ion implantation and execution or non-execution of activation annealing. Activation annealing was not performed for the sample 5 but was performed for the sample 6. The following shows the conditions of ion implantation for the samples 5 and 6:
<Conditions of Ion Implantation>
    Accelerating voltage: 50 keV
    Dose: $5 \times 10^{14}$ cm$^{-2}$
    Angle of implantation: 9 degrees
    Temperature: 25° C.

Figure 9:
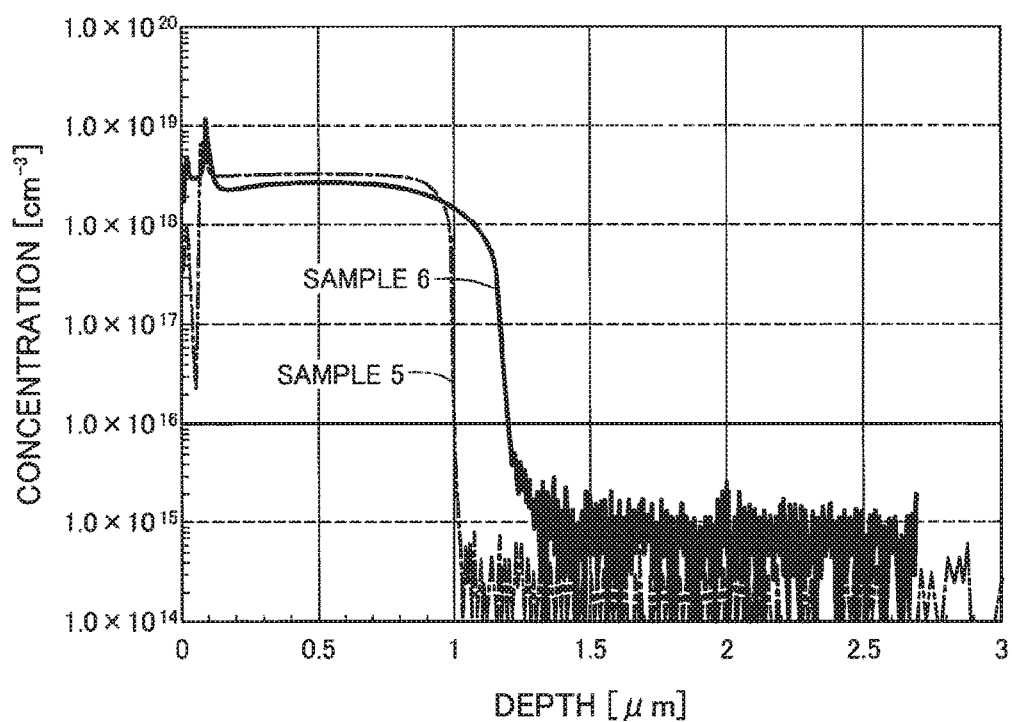
FIG. 9 is a graph showing results of a third evaluation test.

FIG. 9 is a graph showing the results of the third evaluation test. FIG. 9 shows the results of measurement of the concentration of magnesium (Mg) as impurity in the p-type semiconductor layer 114 and in the n-type semiconductor layer 112 of each sample by secondary ion mass spectrometry (SIMS). In the graph of FIG. 9, the abscissa shows the depth (μm) in the −Z-axis direction of the p-type semiconductor layer and the n-type semiconductor layer, and the ordinate shows the concentration (cm$^{-3}$) of magnesium (Mg). The depth of 0 μm denotes a +Z-axis direction side surface of the p-type semiconductor layer. The detection lower limit of magnesium (Mg) in this test is $5 \times 10^{14}$ cm$^{-3}$.

The results of FIG. 9 show the following. A region having the magnesium concentration of not lower than $1.0 \times 10^{16}$ cm$^{-3}$ is a region to the depth of approximately 1.0 μm in the sample 5 and is a region to the depth of approximately 1.2 μm in the sample 6. The region to the depth of 1.0 μm is a region of a p-type semiconductor layer. This shows that the p-type impurity-containing region 118 is not formed in the sample 5 and that the p-type impurity-containing region 118 is formed in thickness of approximately 0.2 μm in the sample 6. The sample 5 is the sample without activation annealing, and the sample 6 is the sample with activation annealing. The results of FIG. 9 accordingly show that the p-type impurity-containing region 118 is not formed without activation annealing.

A-4-4. Fourth Evaluation Test

Figure 10:
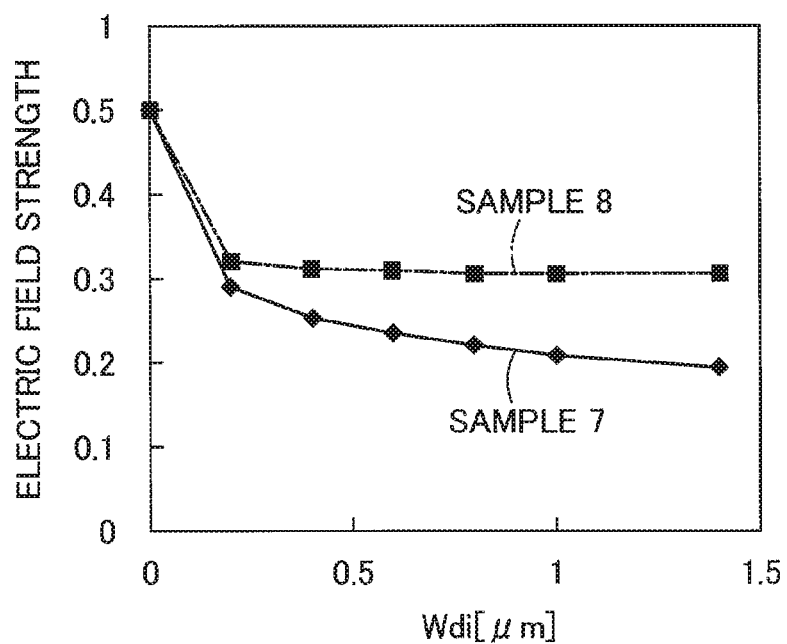
FIG. 10 is a graph showing relationships between electric field strength of an outer periphery of a bottom face of a trench and Wdi.

A fourth evaluation test evaluated the effect of the positional relationship between the trench 122 and the p-type impurity-containing regions 118 on the electric field strength and the on-resistance. In the fourth evaluation test, the examiner manufactured a sample 7 by the same method as that of the first embodiment and a sample 8 having a different depth Dt of the trench 122. The samples 7 and 8 were respectively manufactured with changing Wdi to 0.0 μm, 0.2 μm, 0.4 μm, 0.6 μm, 0.8 μm, 1.0 μm and 1.4 μm.
<Conditions of Sample 7>
    Depth Dt of the trench 122: 1.0 μm (Ddi: 0.3 μm)
    Width Wdi of the p-type impurity-containing regions 118 overlapping with the trench 122: 0.0 μm-1.4 μm
    Width Wt of the trench 122: 2.0 μm
<Conditions of Sample 8>
    Depth Dt of the trench 122: 1.2 μm (Ddi: 0.1 μm)
    Width Wdi of the p-type impurity-containing regions 118 overlapping with the trench 122: 0.0 μm-1.4 μm
    Width Wt of the trench 122: 2.0 μm FIG. 10 is a graph showing relationships between the electric field strength of the outer periphery of the bottom face of the trench 122 and Wdi. The ordinate shows the electric field strength when the electric field strength under the conditions of Dt=1.0 μm and Wdi=0.0 μm is set equal to 1 with regard to the sample 7, and shows the electric field strength when the electric field strength under the conditions of Dt=1.2 μm and Wdi=0.0 μm is set equal to 1 with regard to the sample 8. The abscissa shows Wdi.

Figure 11:
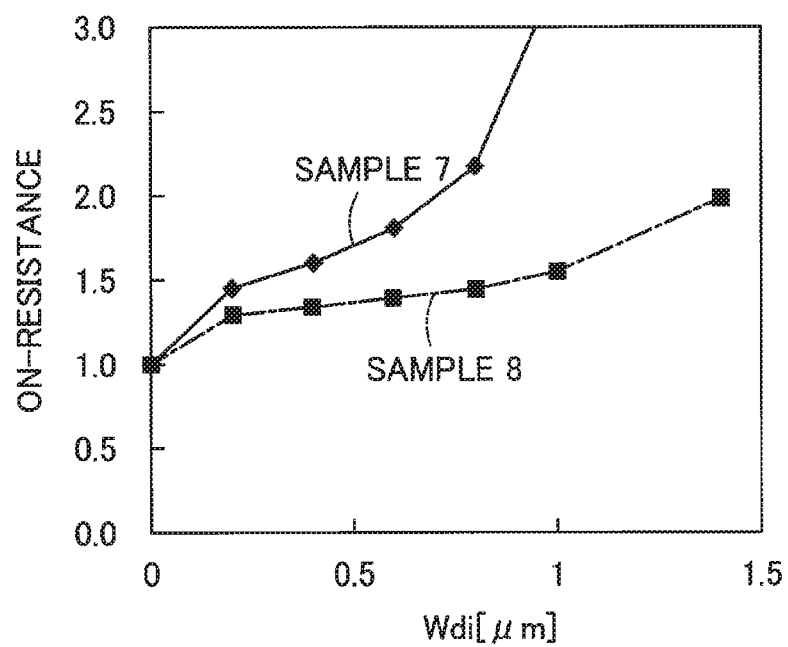
FIG. 11 is a graph showing relationships between on-resistance and Wdi.

FIG. 11 is a graph showing relationships between the on-resistance and Wdi. The ordinate shows the on-resistance when the on-resistance under the conditions of Dt=1.0 μm and Wdi=0.0 μm is set equal to 1 with regard to the sample 7, and shows the on-resistance when the on-resistance under the conditions of Dt=1.2 μm and Wdi=0.0 μm is set equal to 1 with regard to the sample 8. The abscissa shows Wdi. The results of the sample 7 (Dt=1.0 μm) at Wdi=1.0 μm and 1.4 μm have significantly high values of the on-resistance and are excluded from the graph of FIG. 11.

As shown in FIG. 10, the electric field strength decreases at Wdi of greater than 0.0 μm and decreases with an increase in Wdi. This shows improvement of the breakdown voltage of the semiconductor device. The electric field strength significantly decreases at Wdi of not less than double the thickness of the insulating film 130 (not less than 0.2 μm according to the embodiment). As shown in FIG. 11, the on-resistance decreases with a decrease in Wdi. The results of the sample 8 (Dt=1.2 μm) show that the on-resistance is maintained at the low level when Wdi is less than 1.4 μm, i.e., less than 2Wt/3. In summary, the foregoing results show that the relationship of 0<Wdi<Wt improves the breakdown voltage of the semiconductor device and decreases the on-resistance without increasing the capacitance between the drain and the source. The foregoing results also show that Wdi of not less than double the thickness of the insulating film 130 and of less than 2Wt/3 further improves the breakdown voltage of the semiconductor device and further decreases the on-resistance without increasing the capacitance between the drain and the source. As shown in FIG. 11, the on-resistance does not significantly increase with an increase in Wdi when Dt has a larger value, i.e., when Ddi has a larger value. In terms of improvement in breakdown voltage of the semiconductor device and a further decrease in on-resistance without increasing the capacity between the drain and the source, Wdi is preferably not greater than 0.3 µm, is more preferably not greater than 0.2 µm and is furthermore preferably not greater than 0.1 µm.

B. Second Embodiment

Figure 12:
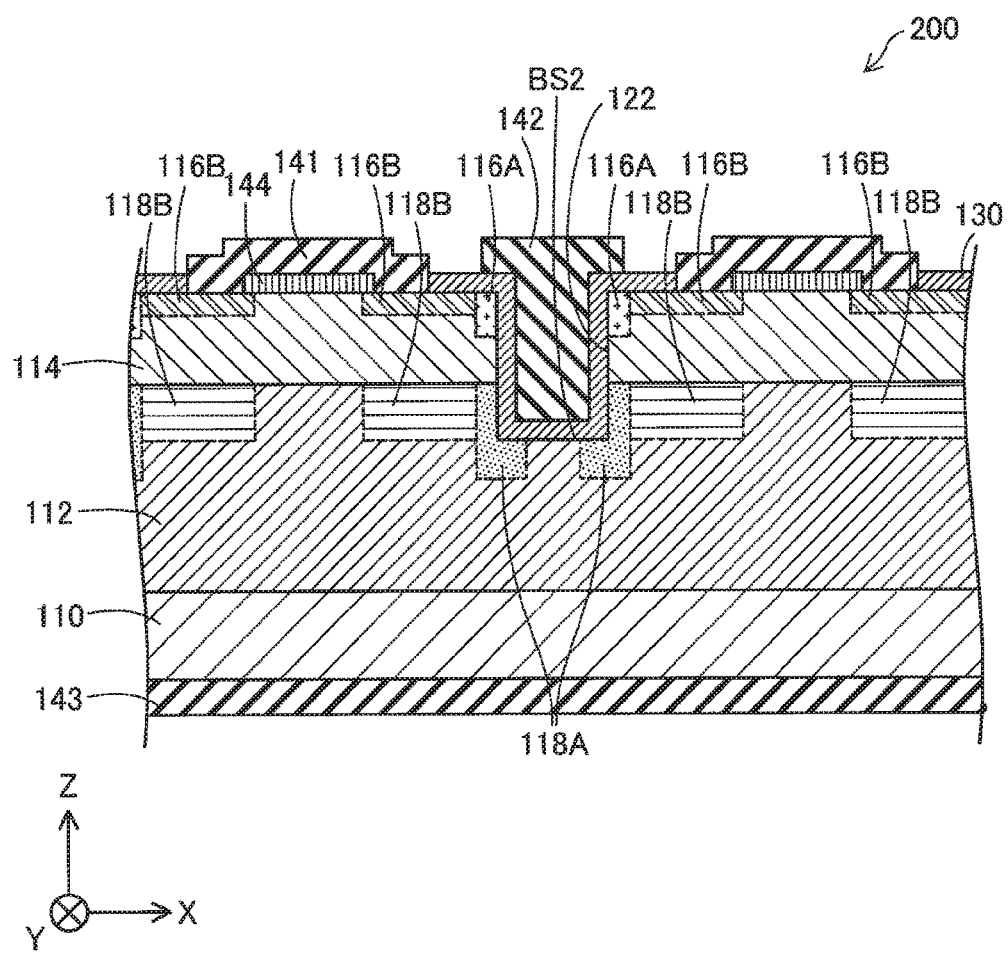
FIG. 12 is a cross-sectional view schematically illustrating the configuration of a semiconductor device according to a second embodiment.

FIG. 12 is a cross-sectional view schematically illustrating the configuration of a semiconductor device 200 according to a second embodiment. The semiconductor device 200 of the second embodiment differs from the semiconductor device 100 of the first embodiment by (i) providing first n-type semiconductor regions 116A and second n-type semiconductor regions 116B in place of the n-type semiconductor regions 116 of the semiconductor device 100; and (ii) providing first p-type impurity-containing regions 118A and second p-type impurity containing regions 118B in place of the p-type impurity-containing regions 118 of the semiconductor device 100, but otherwise has a similar configuration.

According to the first embodiment, the p-type impurity-containing regions 118 are formed in the process of ion implantation to form the n-type semiconductor regions 116. According to the second embodiment, on the other hand, the first p-type impurity-containing regions 118A are formed in the process of ion implantation to form the first n-type semiconductor regions 116A, and the second p-type impurity-containing regions 118B are formed in the process of ion implantation to form the second n-type semiconductor regions 116B. In other words, the first embodiment performs the ion implantation process only once, but the second embodiment performs the ion implantation process twice.

According to the second embodiment, part of the bottom face BS2 of the trench 122 is formed by the first p-type impurity-containing regions 118A. The second p-type impurity containing regions 118B are formed from positions adjoining to the first p-type impurity-containing regions 118A to positions below the outer peripheries of the body electrodes 144.

In the stacking direction (Z-axis direction), the first n-type semiconductor regions 116A are arranged to overlap with the outer periphery of the bottom face of the trench 122 and with the first p-type impurity-containing regions 118A. The second n-type semiconductor regions 116B are arranged to overlap with the second p-type impurity-containing regions 118B but not overlap with the outer periphery of the bottom face of the trench 122.

According to the second embodiment, the dose of ion implantation to form the first n-type semiconductor regions 116A is greater than the dose of ion implantation to form the second n-type semiconductor regions 116B. Accordingly, the first p-type impurity-containing regions 118A have a greater thickness than the thickness of the second p-type impurity-containing regions 118B. The first n-type semiconductor regions 116A have a greater depth in the stacking direction (Z-axis direction) than the depth of the second n-type semiconductor regions 116B. The average concentration of the p-type impurity in the p-type semiconductor layer 114 at the positions overlapping with the first n-type semiconductor regions 116A in the stacking direction (Z-axis direction) is lower than the average concentration of the p-type impurity in the p-type semiconductor layer 114 at the positions overlapping with the second n-type semiconductor regions 116B in the stacking direction (Z-axis direction). The configuration of the semiconductor device 200 of the second embodiment suppresses an increase in capacity between the drain and the source, while improving the breakdown voltage of the semiconductor device, like the semiconductor device 100 of the first embodiment. Compared with the configuration of the semiconductor device 100 of the first embodiment, the configuration of the semiconductor device 200 of the second embodiment has the reduced thicknesses of the p-type semiconductor layer 114 and the first p-type impurity-containing regions 118A, due to the presence of the second p-type impurity-containing regions 118B. This further decreases the capacity between the drain and the source.

C. Third Embodiment

Figure 13:
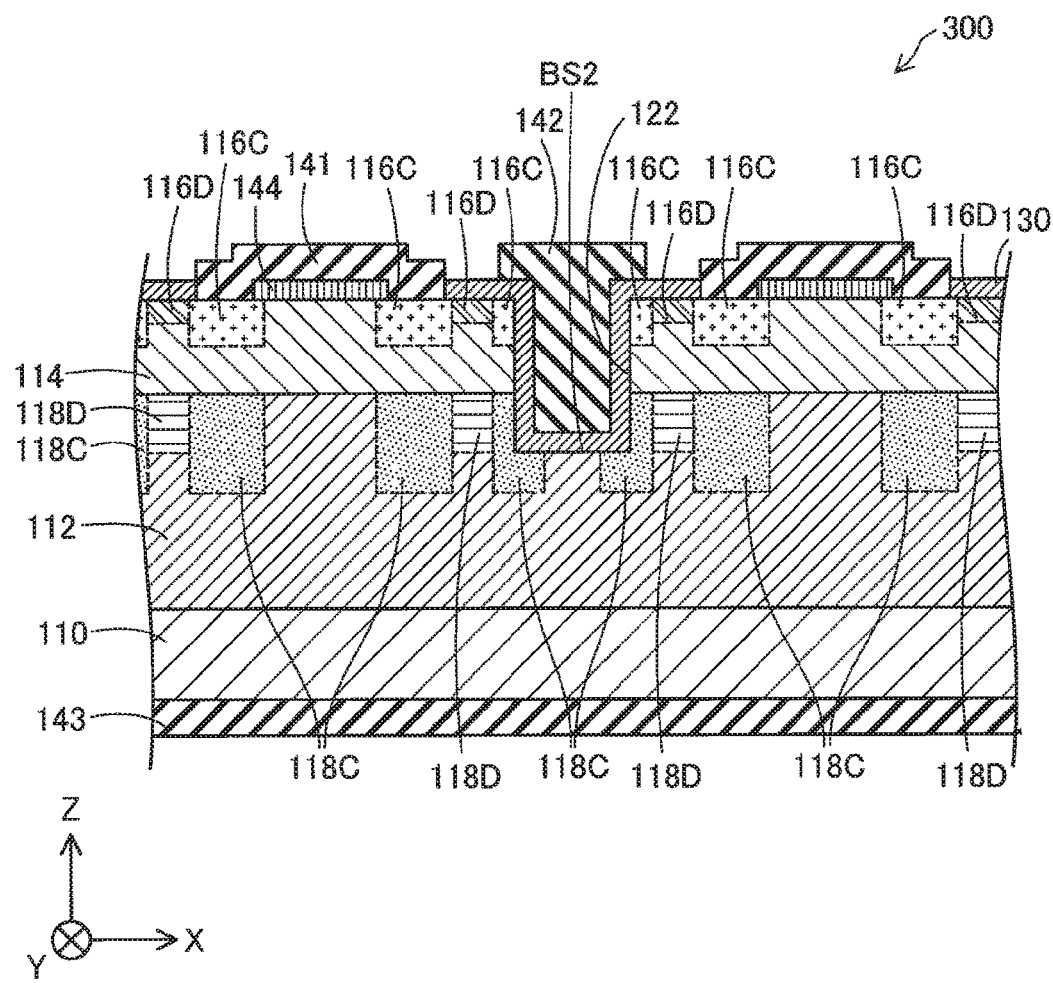
FIG. 13 is a cross-sectional view schematically illustrating the configuration of a semiconductor device according to a third embodiment.

FIG. 13 is a cross-sectional view schematically illustrating the configuration of a semiconductor device 300 according to a third embodiment. The semiconductor device 300 of the third embodiment differs from the semiconductor device 200 of the second embodiment by (i) providing n-type semiconductor regions 116C and n-type semiconductor regions 116D in place of the first n-type semiconductor regions 116A and the second n-type semiconductor regions 116B of the semiconductor device 200; and (ii) providing p-type impurity-containing regions 118C and p-type impurity containing regions 118D in place of the first p-type impurity-containing regions 118A and the second p-type impurity-containing regions 118B of the semiconductor device 200, but otherwise has a similar configuration.

According to the third embodiment, part of the bottom face BS2 of the trench 122 is formed by the p-type impurity-containing regions 118C. The p-type impurity-containing regions 118C are also formed below the portions where the source electrode 141 adjoins the p-type semiconductor layer 114. The p-type impurity-containing region 118D is formed between the p-type impurity-containing region 118C adjoining part of the bottom face BS of the trench 122 and the p-type impurity-containing region 118C formed below the portion where the source electrode 141 adjoins the p-type semiconductor layer 114. The configuration of the semiconductor device 300 of the third embodiment suppresses an increase in capacity between the drain and the source, while improving the breakdown voltage of the semiconductor device, like the semiconductor device 100 of the first embodiment. Compared with the configuration of the semiconductor device 200 of the second embodiment, the configuration of the semiconductor device 300 of the third embodiment reduces the contact resistance between the n-type semiconductor region 116C and the source electrode 141 and thereby reduces the on-resistance.

D. Fourth Embodiment

Figure 14:
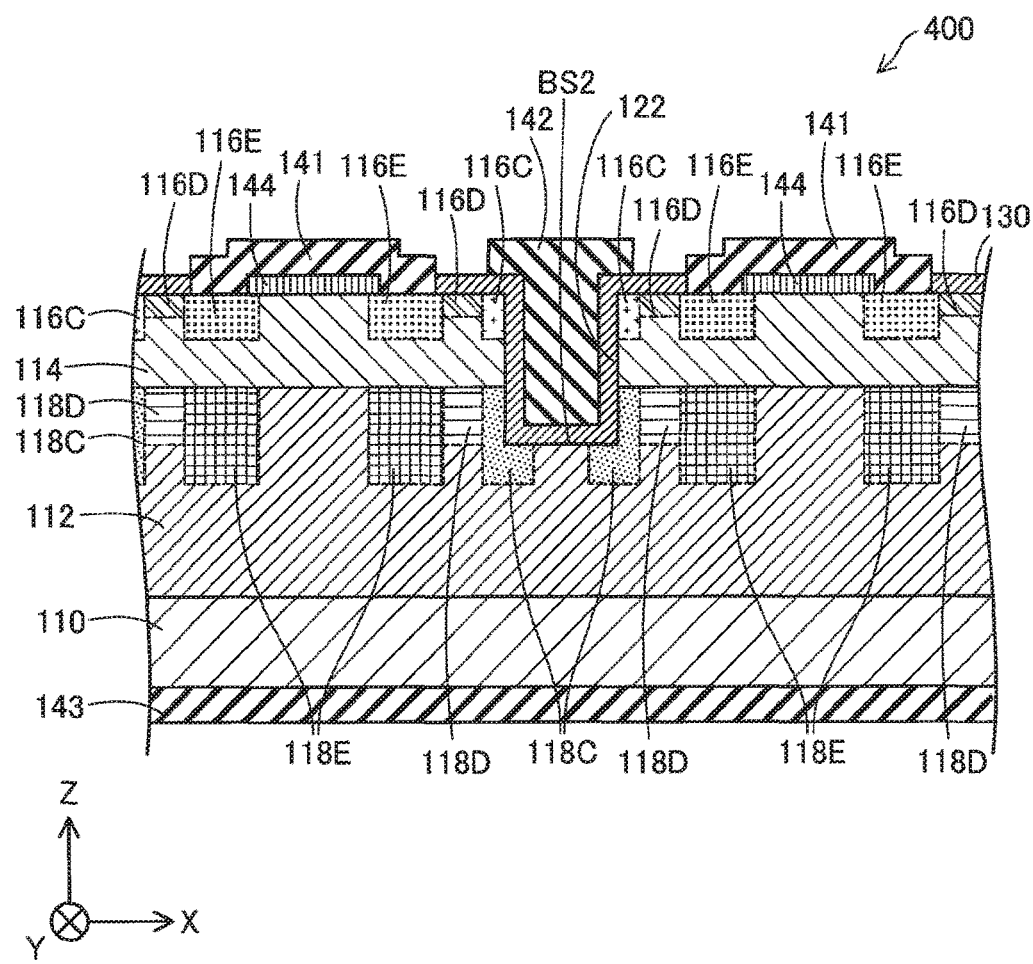
FIG. 14 is a cross-sectional view schematically illustrating the configuration of a semiconductor device according to a fourth embodiment.

FIG. 14 is a cross-sectional view schematically illustrating the configuration of a semiconductor device 400 according to a fourth embodiment. The semiconductor device 400 of the fourth embodiment differs from the semiconductor device 300 of the third embodiment by (i) providing n-type semiconductor regions 116E in place of the n-type semiconductor regions 116C in the portions where the source electrode 141 adjoins the p-type semiconductor layer 114; and (ii) providing p-type impurity-containing regions 118E in place of the p-type impurity-containing regions 118C below the n-type semiconductor regions 116E, but otherwise has a similar configuration. The configuration of the semiconductor device 400 of the fourth embodiment suppresses an increase in capacity between the drain and the source, while improving the breakdown voltage of the semiconductor device, like the semiconductor device 100 of the first embodiment. The configuration of the semiconductor device 400 of the fourth embodiment causes the concentration of the n-type impurity in the n-type semiconductor regions 116E to be higher than the concentration of the n-type impurity in the n-type semiconductor regions 116C, so as to reduce the contact resistance between the n-type semiconductor region 116E and the source electrode 141 and thereby reduces the on-resistance.

E. Other Embodiments

The disclosure is not limited to any of the embodiment, the examples, and the modifications described above but may be implemented by a diversity of other configurations without departing from the scope of the disclosure. For example, the technical features of any of the embodiment, the examples and the modifications corresponding to the technical features of each of the aspects described in SUMMARY may be replaced or combined appropriately, in order to solve part or all of the problems described above or in order to achieve part or all of the advantageous effects described above. Any of the technical features may be omitted appropriately unless the technical feature is described as essential herein.

The semiconductor device which the present disclosure is applied to is not limited to the vertical trench MISFET described in the above embodiments. The semiconductor device which the present disclosure is applied to may be any semiconductor device that has a trench gate structure and controls the electric current based on the principle that an inversion layer is formed by a control electrode, for example, an insulated gate bipolar transistor (IGBT).

The above embodiment uses magnesium (Mg) as the p-type impurity. The present disclosure is, however, not limited to this embodiment. The p-type impurity used may be, for example, beryllium (Be), carbon (C) or zinc (Zn).

The above embodiment uses silicon (Si) as the n-type impurity. The present disclosure is, however, not limited to this embodiment. The n-type impurity used may be, for example, oxygen (O) or germanium (Ge).

In the above embodiment, the material of the substrate and the semiconductor layer is not limited to gallium nitride (GaN) but may be another semiconductor, for example, silicon (Si), silicon carbide (SiC), gallium oxide ($Ga_2O_3$) or gallium arsenide (GaAs).

In the above embodiments, the n-type semiconductor layer 112 and the p-type semiconductor layer 114 are provided in this sequence on the substrate 110. The present disclosure is, however, not limited to this configuration. An additional p-type semiconductor layer may be provided on the p-type semiconductor layer 114. This additional p-type semiconductor layer may have an average value of concentration of the p-type impurity that is higher than the average value of concentration of the p-type impurity in the p-type semiconductor layer 114. In other words, a surface of the p-type semiconductor layer adjoining the source electrode 141 may have a higher concentration of the p-type impurity than the concentration of the p-type impurity in a surface adjoining the n-type semiconductor layer 112. This configuration reduces the contact resistance between the p-type semiconductor layer and the body electrode 144. This additional p-type semiconductor layer may contain magnesium (Mg) as the acceptor element. This additional p-type semiconductor layer may have an average value of concentration of magnesium (Mg) of $1 \times 10^{19}$ $cm^{-3}$ and a thickness (length in the Z-axis direction) of 0.1 μm.

In the above embodiment, the p-type impurity-containing region 118 is the region formed by diffusion. The present disclosure is, however, not limited to this embodiment. The p-type impurity-containing region 118 may be formed by embedding.

In the above embodiments, the drain electrode 143 is formed on the −Z-axis direction surface of the substrate 110. The drain electrode 143 may, however, be formed on the +Z-axis direction surface of the substrate 110.

In the above embodiments, the p-type impurity-containing region 118 is provided at the position that does not partly overlap with the source electrode 141 in the stacking direction (Z-axis direction). The p-type impurity-containing region 118 may, however, be provided at a position that does not overlap with the source electrode 141.

In the above embodiments, the material of the insulating film may be any material having electrical insulating properties and may be, for example, at least one of silicon nitride (SiNx), aluminum oxide ($Al_2O_3$), aluminum nitride (AlN), zirconium oxide ($ZrO_2$), hafnium oxide ($HfO_2$), silicon oxynitride (SiON), aluminum oxynitride (AlON), zirconium oxynitride (ZrON) and hafnium oxynitride (HfON), in addition to silicon oxide ($SiO_2$). The insulating film may have a single-layered structure or may have a multi-layered structure of two or more layers. The technique employed to form the insulating film is not limited to ALD but may be ECR sputtering or ECR-CVD.

In the above embodiments, the semiconductor device 100 has the two-layered structure of the substrate 110 and the n-type semiconductor layer 112 as the n-type semiconductor layer. The present disclosure is, however, not limited to this configuration. The n-type semiconductor layer may have a single-layered structure or may have a multi-layered structure of three or more layers. In the above embodiments, the n-type semiconductor regions 116 are provided in the p-type semiconductor layer 114. A second n-type semiconductor layer may be provided additionally on the p-type semiconductor layer 114. The substrate may be made of a p-type semiconductor.

What is claimed is:

1. A semiconductor device having a trench gate structure, comprising:
    a first n-type semiconductor layer configured to contain an n-type impurity;
    a p-type semiconductor layer configured to be formed on the first n-type semiconductor layer and contain a p-type impurity and having a trench, the trench is recessed to pass through the p-type semiconductor layer and reaches the first n-type semiconductor layer;
    an insulating film configured to be arranged to cover a surface of the trench and made of an insulator;
    a gate electrode configured to be formed on the insulating film in the trench;

a source electrode configured to be formed on a second n-type semiconductor layer provided on the p-type semiconductor layer; and a drain electrode configured to be formed on an opposite side to the p-type semiconductor layer across the first n-type semiconductor layer, wherein the first n-type semiconductor layer includes a p-type impurity-containing region configured to contain a p-type impurity at a higher concentration than an n-type impurity, the p-type impurity-containing region is arranged to adjoin the p-type semiconductor layer, and when viewed in a stacking direction of the first n-type semiconductor layer and the p-type semiconductor layer, the p-type impurity-containing region is provided at a position that does not overlap with at least partly the source electrode and that overlaps with an outer periphery of a bottom face of the trench.

2. The semiconductor device according to claim 1, wherein an average concentration of the p-type impurity in the p-type semiconductor layer at a position that overlaps with the p-type impurity-containing region in the stacking direction is lower than an average concentration of the p-type impurity in the p-type semiconductor layer at a position that does not overlap with the p-type impurity-containing region when viewed in the stacking direction.

3. The semiconductor device according to claim 1, wherein when Wdi represents a width of the p-type impurity-containing region overlapping with the trench in the stacking direction and Wt represents a width of the trench in the stacking direction, Wdi is equal to or greater than twice a thickness of the insulating film and is less than 2/3 times of Wt.

4. The semiconductor device according to claim 1, wherein a surface of the p-type semiconductor layer that adjoins the source electrode has a higher concentration of the p-type impurity than a concentration of the p-type impurity in a surface of the p-type semiconductor layer that adjoins the first n-type semiconductor layer.

5. The semiconductor device according to claim 1, wherein the second n-type semiconductor layer is a first n-type semiconductor region configured to be provided in the p-type semiconductor layer and contain the n-type impurity, and the first n-type semiconductor region is arranged to overlap with the outer periphery of the bottom face of the trench and with the p-type impurity-containing region when viewed in the stacking direction.

6. The semiconductor device according to claim 5, further comprising:

a second n-type semiconductor region configured to be arranged not to overlap with the outer periphery of the bottom face of the trench when viewed in the stacking direction and have a lower concentration of the n-type impurity than a concentration of the n-type impurity in the first n-type semiconductor region.

7. The semiconductor device according to claim 6, wherein the first n-type semiconductor region has a greater depth in the stacking direction than a depth of the second n-type semiconductor region.

8. The semiconductor device according to claim 6, wherein an average concentration of the p-type impurity in the p-type semiconductor layer at a position overlapping with the first n-type semiconductor region is lower than an average concentration of the p-type impurity in the p-type semiconductor layer at a position overlapping with the second n-type semiconductor region.

\* \* \* \* \*